United States Patent
Arvinte et al.

(10) Patent No.: US 10,432,433 B2
(45) Date of Patent: Oct. 1, 2019

(54) SOFT BIT COMPUTATION UNIT FOR MIMO DETECTION AND ERROR CORRECTION

(71) Applicant: NXP USA, Inc., Austin, TX (US)

(72) Inventors: Marius O. Arvinte, Focsani (RO); Andrei A. Enescu, Bucharest (RO); Leo G. Dehner, Euless, TX (US)

(73) Assignee: NXP USA, Inc., Austin, TX (US)

(*) Notice: Subject to any disclaimer, the term of this patent is extended or adjusted under 35 U.S.C. 154(b) by 128 days.

(21) Appl. No.: 15/827,798

(22) Filed: Nov. 30, 2017

(65) Prior Publication Data

US 2019/0081824 A1   Mar. 14, 2019

(30) Foreign Application Priority Data

Sep. 14, 2017  (RO) ............................. A/201700655

(51) Int. Cl.
*H04L 25/03* (2006.01)
*H03M 13/29* (2006.01)
(Continued)

(52) U.S. Cl.
CPC .. *H04L 25/03216* (2013.01); *H03M 13/2714* (2013.01); *H03M 13/2957* (2013.01); *H04L 1/0045* (2013.01); *H04L 25/03191* (2013.01); *H04L 2025/0342* (2013.01); *H04L 2025/03426* (2013.01)

(58) Field of Classification Search
CPC ........ H04L 25/03216; H04L 25/03191; H03M 13/2957; H03M 13/2714
See application file for complete search history.

(56) References Cited

U.S. PATENT DOCUMENTS 9,066,247 B2 * 6/2015 Zhou ..................... H04W 24/02
9,407,475 B2   8/2016 Kaplan et al.
(Continued)

FOREIGN PATENT DOCUMENTS

EP       2245808 B1    10/2012

OTHER PUBLICATIONS

Kitty Kar Yan Wong, The Soft-Output M-Algorithm and its Applications, 2006.
(Continued)

*Primary Examiner* — Phung M Chung (57) ABSTRACT

A method, system, and apparatus are provided for computing soft bits in a non-linear MIMO detector which decodes a signal received at a plurality of receive antennas using channel estimate information and a decoding tree to produce output data for a bit estimation value which includes a maximum likelihood solution along with a naturally ordered vector identifying all explored node metrics and node indices, where soft bits are computed for each bit estimation value by determining a set of bit-masks through repetition and indexing operations applied on the explored node indices, masking the naturally ordered vector with the set of bit-masks to generate masked node metrics, determining candidate soft bit values by subtracting metrics of all nodes that form the maximum likelihood solution from the masked node metrics, and determining a final soft bit value by identifying which of the candidate soft bit values has a lowest value.

20 Claims, 5 Drawing Sheets

(51) Int. Cl.
*H03M 13/27* (2006.01)
*H04L 1/00* (2006.01)

(56) References Cited

U.S. PATENT DOCUMENTS

| | | | |
|---|---|---|---|
| 10,116,417 B1* | 10/2018 | Arvinte | ............... H04L 27/2666 |
| 2009/0196380 A1* | 8/2009 | Anekoji | ................ H04L 1/0045 375/341 |
| 2009/0296842 A1 | 12/2009 | Papadopoulos et al. | |
| 2010/0083072 A1 | 4/2010 | Prasad et al. | |
| 2011/0022926 A1 | 1/2011 | Hu et al. | |

OTHER PUBLICATIONS

Zhan Guo et al., A Low-Complexity High-Throughput Soft-Output MIMO Decoder, https://www.eurasip.org/Proceedings/Ext/IST05/papers/461.pdf, 2005.

* cited by examiner

SOFT BIT COMPUTATION UNIT FOR MIMO DETECTION AND ERROR CORRECTION

BACKGROUND OF THE INVENTION

Field of the Invention

The present invention is directed in general to field of wireless communication systems. In one aspect, the present invention relates generally to a method and apparatus for generating a soft bit decision from a hard decision signal in a wireless MIMO receiver system.

Description of the Related Art

Wireless communication systems transmit and receive signals within a designated electromagnetic frequency spectrum, but the capacity of the electromagnetic frequency spectrum is limited. As the demand for wireless communication systems continues to expand, there are increasing challenges to improve spectrum usage efficiency. To improve the communication capacity of the systems while reducing the sensitivity of the systems to noise and interference and limiting the power of the transmissions, a number of wireless communication techniques have been proposed based on OFDM ("Orthogonal Frequency Division Multiplexing") and MIMO ("Multiple Input Multiple Output") techniques—such as 3GPP/4G LTE ("Long Term Evolution"), LTE-Advanced and WiMax ("Worldwide Interoperability for Microwave Access") networks. According to OFDM techniques, bits to be transmitted are split into bit sequences which are then modulated by separate and reciprocally orthogonal sub-carriers and multiplexed into a data stream (i.e., a stream of data including (OFDM) symbols, or symbols stream) for transmission. According to MIMO techniques, multiple symbols streams are transmitted and received using multiple transmit antennas and multiple receive antennas, respectively, which send and receive more than one data signal simultaneously over the same radio channel by exploiting multipath propagation.

Figure 1:
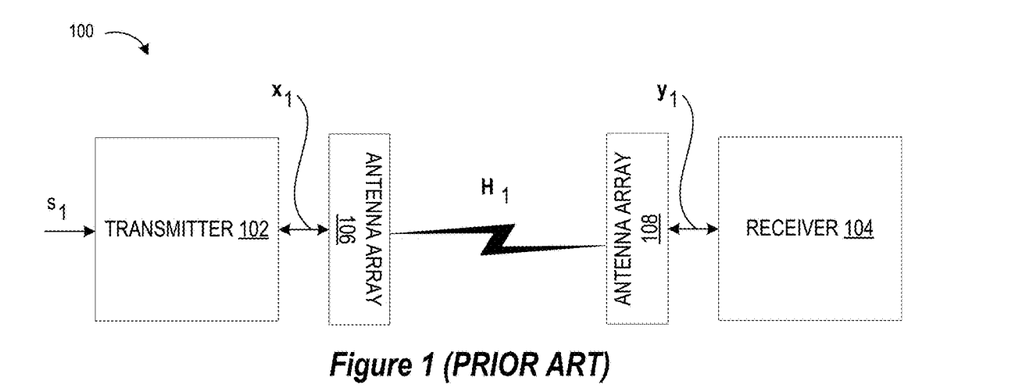
FIG. 1 (labeled prior art) depicts a wireless communication system.

FIG. 1 depicts a MIMO wireless communication system 100 in which a transmitter 102 having a first antenna array 106 communicates with receiver 104 having a second antenna array 108, where each antenna array 106, 108 includes one or more antennas. In the MIMO communication system 100, the transmitter 102 may act as a base station, while the receiver 104 acts as a subscriber station, which can be virtually any type of wireless one-way or two-way communication device such as a cellular telephone, wireless equipped computer system, and wireless personal digital assistant. Of course, the receiver/subscriber station 104 can also transmits signals which are received by the transmitter/base station 102. The signals communicated between transmitter 102 and receiver 104 can include voice, data, electronic mail, video, and other data, voice, and video signals. In operation, the transmitter 102 transmits a signal data stream (e.g., signal $s_1$) through one or more antennas 106 and over a channel $H_1$ to a receiver 104, which combines the received signal from one or more receive antennas 108 to reconstruct the transmitted data. To transmit the signal vector $s_1$, the transmitter 102 prepares a transmission signal, represented by the vector $x_1$, for the signal $s_1$. (Note: lower case hold variables indicate vectors and upper case BOLD variables indicate matrices). The transmission signal vector $x_1$ is transmitted via a channel represented by a channel matrix $H_1$, and is received at the receiver 104 as a receive signal vector $y_1 = H_1 x_1 + n_1$, where $y_1$ represents the $N_r \times 1$ received signal column vector, $x_1$ represents the $N_1 \times 1$ transmitted signal column vector, $n_1$ represents the $N_r \times 1$ co-channel interference or noise signal column vector, and $H_1$ is the $N_r \times N_t$ MIMO channel matrix representing the channel gain between the transmitter antenna array 106 and the subscriber station antenna array 108 with an $N_r \times N_t$ matrix of complex coefficients, where $N_t$ is the number of antennas in the transmitter/base station antenna, array 106 and $N_r$ is the number of antennas in the receiver/subscriber station antenna array 108, As will be appreciated, the elements of the transmitted signal $x_1$ are drawn from a finite set of signal constellation possibilities (e.g., QPSK, 16-QAM, etc.), where a constellation symbol maps a multiple number of bits to a single complex value (e.g. 16-QAM maps 4 bits to a symbol). In this context, the purpose of the MIMO receiver 104 is to correctly estimate the transmitted symbols and infer the bits from them.

To meet the growing number of mobile network users and growing demand for services requiring very high data traffic (such as internet, multimedia and real-time services), improved MIMO receiver decodimg techniques and associated receiver architectures have been proposed to increase throughput. For example, linear MIMO detectors can be used in low complexity receivers to detect and resolve inter-symbol interference present between the transmitted symbols, while non-linear MIMO detectors—such as Maximum-Likelihood, Sphere Decoding, QRD-M, SOMA ("Soft-Output M-Algorithm"), etc.—offer better performance than their linear counterparts that is near-optimal, albeit with higher overall cost and complexity, especially when using soft output decoding to exploit the gain from channel coding. Indeed, conventional approaches for computing soft bit values—which require a large number of comparisons and "if" branches for each soft bit—are not suitable for parallel implementations in a full-complexity hard output decoder. As seen from the foregoing, the existing solutions for efficiently detecting and estimating the transmitted symbols and correctly inferring the soft bits are extremely difficult at a practical level by virtue of the difficulty balancing the design constraints for providing an efficient and cost effective MIMO detector with the performance demands for performing high data rate decoding. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

A system, apparatus, and methodology are described for efficiently computing soft bits in a non-linear MIMO detection and error correction system which uses only fundamental computing operations. In selected embodiments, a soft bit computation engine is disclosed which may be implemented with elementary hardware/software units embodying an arithmetic subtraction block, bit indexing and shifting block, and extrema search block which are connected to process non-linear MIMO detector outputs (e.g., node metrics and indices) and to calculate soft bit log-likelihood ratio (LLR) values for input to an error correction code (ECC) decoder. In selected embodiments of the present disclosure, a non-linear hard output MIMO detector unit receives and processes the received signal y, channel matrix H, and signal constellation C to compute therefrom a first output vector ($\lambda_{ML}$) of the metrics of all nodes that form the Maximum Likelihood ("ML") path, a second naturally ordered output vector (e) of all explored node metrics, and a third output vector (idx) of the indices in the signal constellation C of the retained nodes at each stage. In this context, "naturally ordered" means that the explored nodes that share the same parent node are stored in the node metric vector e in the same order the signal constellation vector C is stored in memory. Using the vector outputs from the non-linear hard output MIMO detector unit, a soft bit computation engine is connected with a mask computation unit (MCU) and a Log-Likelihood Ratio Computation Unit (LCU), each of which may be implemented in either software or hardware for each soft bit being computed for each layer.

For example, a software-embodied MCU may be connected to feed a hardware-embodied LCU (or vice versa). In this example, the MCU may be connected to receive and process the third output vector (idx) along with additional input information in order to generate MCU bit-masks that identify the node error metrics of e having an opposite bit decision to the hard decision bit generated by the hard output MIMO detector unit. In addition, the LCU may be connected to receive and process the first and second output vectors ($\lambda_{ML}$ and e) along with the MCU bit-masks in order to generate the soft bit log-likelihood ratio (LLR) values by masking the e vector with the MCU bit-masks, subtracting the $\lambda_{ML}$ metrics from the masked results, and performing an unsigned extrema search over the aggregated results, and then performing one final multiplication with ±1. In disclosing the claimed apparatus, system, and method for computing soft bits by using individually configurable rules, rather than humans, to compute all possible soft bit values using partially extended and early terminated branches, and then perform a single extrema search operation at the end, there is disclosed an improvement in computer-related technology for improving the performance, speed, and accuracy of a MIMO communication system.

Figure 2:
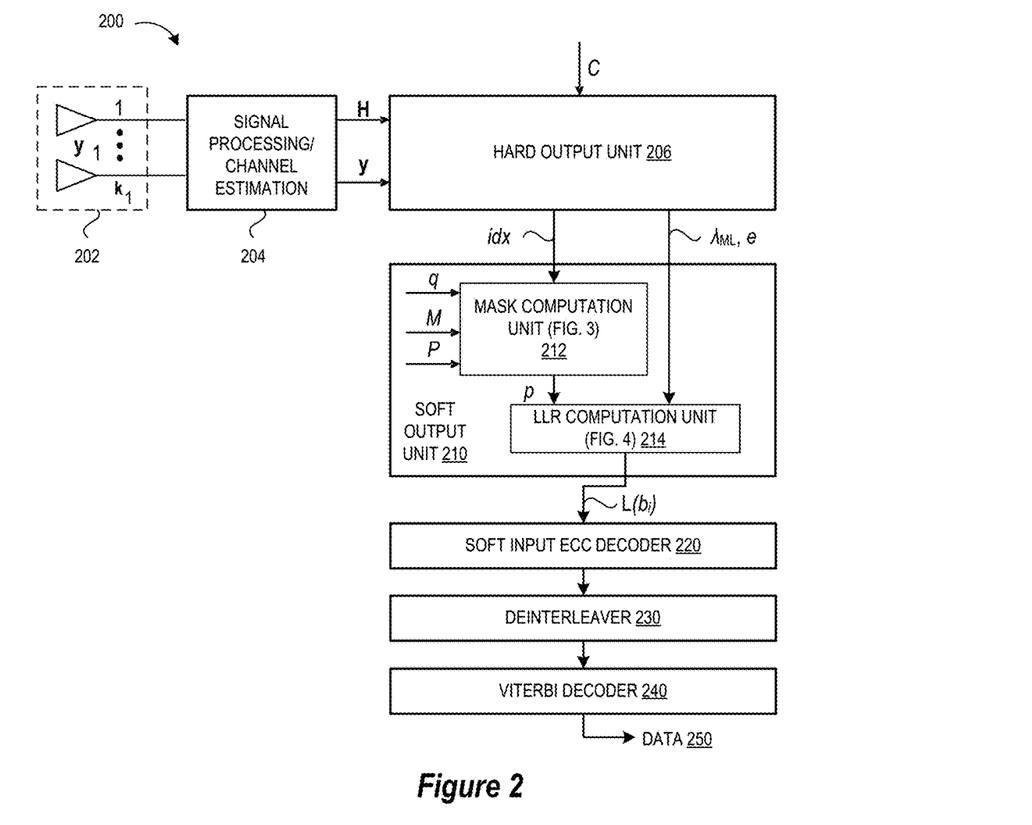
FIG. 2 is a schematic block circuit diagram of a wireless communication receiver system having a non-linear MIMO hard output decoder and soft bit computation engine in accordance with selected embodiments of the present disclosure.

To provide a contextual understanding for selected embodiments of the present disclosure, reference is now made to FIG. 2 which shows a schematic block circuit diagram of a wireless communication receiver system 200 in which the soft-output decoding is fully separated from the hard-output decoding in a non-linear MIMO detector arrangement where the soft bits for a received MIMO signal y are computed by first computing all possible values and masking the results that correspond to a switched bit decision. In the disclosed receiver system 200, there are provided one or more antenna stages 202, a signal processing and channel estimation unit 204, a hard output decoder unit 206 and soft bit computation engine 210. The antenna stage 202 is shown as having two antennas by way of non-limiting example, but persons skilled in the art will appreciate that any number of $k_1$ antennas may be included in such a receiver design. As will be appreciated, each receive antenna in the antenna stage(s) 202 may be used to receive a frequency-divided multiple subcarrier comprising signal such as a signal generated according to the OFDM scheme. And though not shown, each antenna may be coupled to a receiver filter and an analog-to-digital converter stage which may be implemented as an integrated circuit and/or discrete components. Thus, the antenna stage(s) 202 may be realized using any suitable functional component, including but not limited to discrete hardware components and/or by means of a signal processor which implement selected antenna receiver functions in software. Other variations will be apparent to the skilled person. As described hereinabove, a data signal $s_1$ presented at a transmitter for transmission to the receiver system 200 is transformed by the transmitter into a transmission signal represented by the vector $x_i$ which propagates through a matrix channel $H_1$ for reception at the $k_1$ receive antennas 202 where they are represented by the vector $y_1$.

At the receiver system 200, the signal processing unit 204 may be implemented with a signal processing unit which is configured to process the received $y_1$ signals, including combining the $y_1$ signals with appropriate combining vector information, thereby generating a receive signal vector y. In addition, the signal processing unit 204 may include one or more channel estimation stages which are arranged to compute channel gains and channel derivatives for each subcarrier and to generate a channel estimation signal H as an $N_r \times N_t$ MIMO channel matrix output signal. The combined subcarrier signal receive signal vector y and channel estimation signal H are forwarded to the post-processing stage formed by the hard output decoder 206 and soft bit computation engine 210.

At the hard output decoder 206, the symbol information in the receive signal vector y is processed based on channel estimation parameters to produce decoded path information in terms of one or more vector path metrics and index information for the most probable path. In some implementations, the hard output decoder 206 may be embodied as a non-linear MIMO detector, Reed-Solomon code decoder, a Bose-Ray-Chaudhuri "BCH" code decoder, and LDPC decoder, a turbo code decoder, an iterative decoder, or any suitable decoder for determining a decoded path based on at least a portion of the paths. In the non-linear MEMO detector embodiments, the hard output decoder unit 206 processes the receive signal vector y along with the channel matrix H and signal constellation C to compute therefrom tree decode path information specifying the Maximum Likelihood ("ML") path to a binary "1" or "0" output bit value.

For example, the tree decode information may be specified with a first output vector ($\lambda_{ML}$) of the metrics of all nodes that form the ML path, a second naturally ordered output vector (e) of all explored node metrics, and a third output vector (idx) of the indices in the signal constellation C of the retained nodes at each stage.

At the soft bit computation engine 210, the tree decode information from the hard output decoder 216 is processed to assign a value indicating reliability to each one-bit quantized observation from the hard output decoder 216. In order to significantly enhance performance gain that can be obtained by using a soft output decoder, the soft bit computation engine 210 computes and assigns to each detected binary "1" or "0" output bit value a real value in (-Inf, Inf) called LLR (Log-Likelihood Ratio) and given by (for the i-th bit $b_1$):

$$L(b_i) = (-1)^{b_i} * \frac{\log(p(b_i = 0))}{\log(p(b_i = 1))}$$

In selected embodiments, the the soft bit computation engine 210 may be configured to implement a Maximum A-Posteriori probability (MAP) algorithm to reduce complexity with minimal loss of BER performance to approximate the LLR values by computing, for each i-th bit:

$$L(b_i) = (-1)^{b_i} * (\min(e(bi)) - \min(e(\tilde{b}_i))),$$

where $e(b_i)$ are the node metrics from a given tree level that have the same bit decision as the hard-output decoder decision, and where $e(\tilde{b}_i)$ are the node metrics from the same tree level that have an opposite bit decision to the hard-output decoder decision. As will be appreciated, the soft bit computation engine 210 repeatedly computes the soft bits and updates the results for every tree level reached by the hard-output decoder 206.

In selected embodiments, the disclosed soft bit computation engine 210 processes the vector outputs from the hard output decoder 206 with a mask computation unit (MCU) 212 and a Log-Likelihood Ratio Computation Unit (LCU) 214, each of which may be embodied in either software or hardware. However embodied, each MCU 212 and LCU 214 must be implemented for each soft bit being computed for each layer. With these requirements, there are a large number of approaches possible. For example, each MCU 212 and LCU 214 may be embodied with dedicated hardware sub-units that are duplicated for each soft bit of each layer. Alternatively, a fixed number of hardware sub-units that are scheduled in a round-robin fashion may be used for either or both of the MCU 212 and LCU 214. Alternatively a fixed number of hardware sub-units may be accompanied by software implementation of the other units. For example, a software-embodied MCU 212 may be connected to feed a hardware embodied LCU (or vice versa). In this example, the MCU 212 may be connected to receive and process the third output vector (idx) along with additional input information in order to generate MCU bit-masks p that identify the node error metrics of e having an opposite bit decision to the hard decision bit generated by the hard output MIMO detector unit 206. In addition, the hardware-embodied LCU 214 may be connected to receive and process the first and second output vectors ($\lambda_{ML}$ and e) along with the MCU bit-masks in order to generate the soft bit log-likelihood ratio (LLR) values as an LLR output signal $L(b_i)$.

In decoding operations for the receiver 200, the soft bit computation engine 210 may be arranged to receive and process the tree decode information (e.g., output vectors $\lambda_{ML}$, e, and idx) from the hard output unit 206. By using inputs to the MCU 212 specifying the number of bits per constellation symbol (e.g., q=$\log_2$Q), a vector representation giving the number of retained nodes at each stage (e.g., M=$N_t \times 1$ vector), and a matrix presentation of the binary entries that represents the bit-to-symbol mapping (e.g., P=Q×q matrix), the MCU 212 may receive and process the output vector (idx) in order to generate MCU bit-masks $p_{i,k}^{(j)}$ that identify the node error metrics of the naturally ordered vector of all explored node metrics (e.g., e) having an opposite bit decision to the hard decision bit generated by the hard output MIMO detector unit 206. Since it is expected in practice that the constellation vector C rarely, if ever, changes its content, the same constellation vector C can be used for the hard output decoder 206, meaning that the tree nodes will be naturally explored in the order given by its elements.

Using the MCU bit-masks $p_{i,k}^{(j)}$ as an input, the LCU 214 may receive and process the output vectors ($\lambda_{ML}$, e) in order to generate the LLR output signal $L(b_i)$. In selected embodiments, the LCU may be configured generate the soft bit log-likelihood ratio (LLR) values by masking the e vector with the MCU bit-masks $p_{i,k}^{(j)}$ subtracting the $\lambda_{ML}$ metrics from the masked results, and performing an unsigned extrema search over the aggregated results, and then performing one final multiplication with ±1. It is however emphasized that alternative decoding algorithms may be used for the soft bit computation engine 210 so that the exact implementation of the post-processing or decoding stage is not essential to the present invention and any suitable implementation may be contemplated.

The LLR output signal $L(b_i)$ is forwarded to the soft input ECC decoder 220 which performs error correction of the bit $b_k$ using the LLR output signal ($L(b_i)$), that is, a soft decision value output from the soft bit computation engine 210. In this case, the error correction mechanism that may be implemented by the ECC decoder 220 is, for example, the maximum likelihood decoding scheme using the soft decision Viterbi. The error correction mechanism may also be turbo decoding or low density parity check (LDPC) that performs repetitive decoding using maximum a posteriori probability (MAP) decoding or belief propagation decoding (BPD).

The ECC decoder 220 output is provided to the deinterleaver block 220 in which interleaving and/or scrambling operations may be performed, and the deinterleaved output signal is provided to the decoder 240, such as a Viterbi decoder, for decoding the encoded signal generated by the transmitter of the signal received by the receiver 200. The decoder 240 produces the data 250 to be forwarded to a further data processor (not shown).

Figure 3:
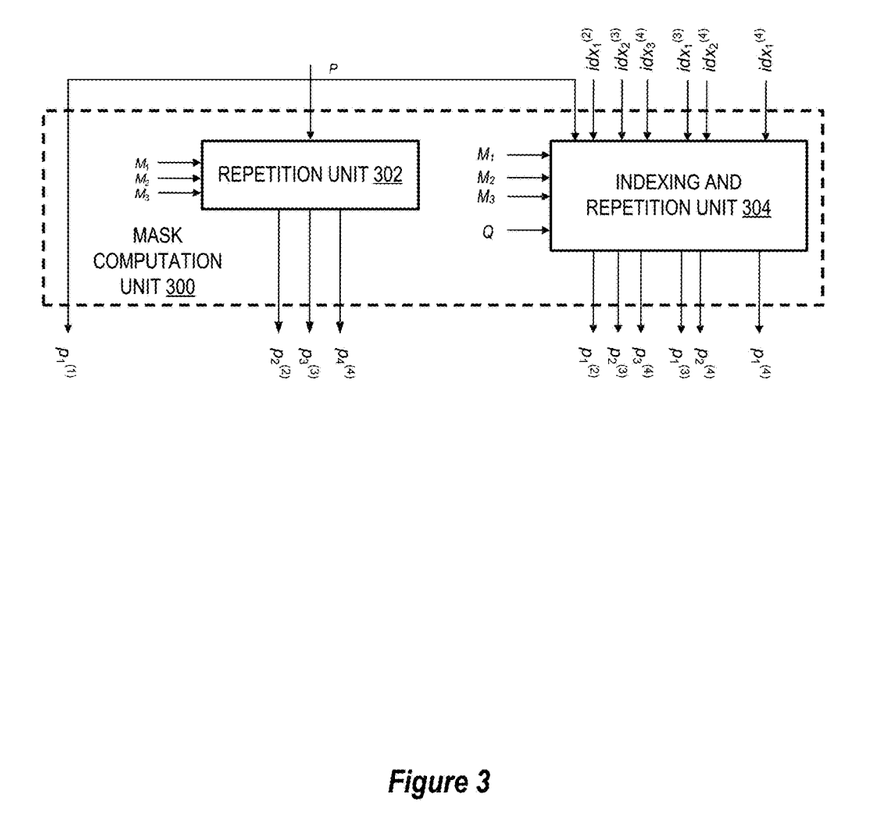
FIG. 3 is a schematic block circuit diagram of a mask computation unit used in the soft hit computation engine in accordance with selected embodiments of the present disclosure.

To provide additional details for an improved understanding of selected embodiments of the present disclosure, reference is now made to FIG. 3 which shows a schematic block circuit diagram of a mask computation unit (MCU) 300 in accordance with selected embodiments of the present disclosure. As depicted, the MCU 300 includes a repetition unit 302 and an indexing and repetition unit 304 which are connected in an example configuration to generate bit-masks p to assist with MIMO decoding of a signal x sent with $N_t$=4 transmit antennas, though it will be appreciated that extensions are straightforward for different transmit antenna configurations. In whatever transmit antenna configuration is being used, each bit-mask p generated by the MCU 300 identifies the node error metrics of the naturally ordered node metric vector e having an opposite bit decision to the hard decision bit, such as by setting the value "1" in those locations.

With the MCU 300 generating, for each soft bit of each layer, multiple masks, one for each tree level, each mask may be stored as a lookup table and indexed using the denotation $p_{i,k}^{(j)}$, where:

i—Layer index for which the mask is applied, i=1 ... $N_t$, j—Tree level from which the soft values are taken from, j=1 ... $N_t$, and k—Soft bit index for which the mask is applied, k=1 ... q.

In the example case for the MCU 300 in which $N_t$=4, there are some observations about the masks $p_{i,k}^{(j)}$ that can be made. First, it is noted that the index k will produce perfectly uncorrelated or independent sets of masks (different per soft bit). As a result, references to the index k will be omitted from the bit mask notation from this point forward. Second, it is noted that only masks that satisfy the inequality i≤j are generated. This results from the mathematical constraints imposed by a tree decoding algorithm whereby soft bits for the i-th layer can only come from the i-th or later tree stage.

Based on how the constellation is stored, the MCU 300 generates the bit masks $p_i^{(k)}$ that are derived from P and, in some cases, the indices of the surviving candidate branches. The masks can be derived in a multi-tiered fashion. In the first tier, the easiest bit masks to derive are the masks that satisfy i=j where each bit mask value consists of serial repetitions of the first bit mask $p_1^{(1)}$=P. To this end, the repetition unit 302 may be configured to generate the masks $p_i^{(i)}$ that satisfy i=j by repetition of the k-th column of the P bit-to-symbol mapping matrix (where we also omit the k index and use P for the notation of the column):

$p_1^{(1)}$=P $p_2^{(2)}$=P repeated $M_1$ times $p_3^{(3)}$=P repeated $M_2$ times $p_4^{(4)}$=P repeated $M_3$ times The length of the bit masks generated by the repetition unit 302 is equal to Q, $M_1$Q, $M_2$Q and $M_3$Q, respectively, which correspond to the number of visited nodes at each stage of the tree, with the Mk values being elements of the M vector. In addition, the bit masks with i=j are never updated real-time (as the bit-to-symbol P mapping never changes), so they only need to be generated and stored once by the repetition unit 302.

In the next tiers of bit mask computations, the remaining bit masks (i.e., the ones with i<j) are generated by the indexing and repetition unit 304 which is configured to perform indexing operations based on the indices $idx_i^{(j)}$ generated by the hard output unit, followed by repetition and concatenation operations. Note that the same convention is used to write the index values $idx_i^{(j)}$ for the surviving candidate indices of the i-th layer at the j-th tree level.

In particular, the next tier of bit mask computations is to compute the bit masks that satisfy t=j-1. Instead of simply being computed as repetitions of P, the indexing and repetition unit 304 computes these bit mask values as serial repetitions of certain elements of P as given by the indices of the surviving $1^{st}$ order parents as follows:

$p_1^{(2)}$=P $[idx_1^{(2)}[0]]$ repeated Q times ... P $[idx_1^{(2)}$ $[M_1-1]]$ repeated Q times $p_2^{(3)}$=P $[idx_2^{(3)}[0]]$ repeated Q times ... P $[idx_2^{(3)}$ $[M_2-1]]$ repeated Q times $p_3^{(4)}$=P $[idx_3^{(4)}[0]]$ repeated Q times ... P $[idx_3^{(4)}$ $[M_3-1]]$ repeated Q times.

As seen from the foregoing, the length of these masks is equal to $M_1$Q, $M_2$Q and $M_3$Q, respectively, thereby reflecting the number of visited nodes at each stage of the tree except for the first one, whose mask cannot satisfy i=j-1 anymore.

To provide an example illustration of this second tier for computing bit masks that satisfy i=j-1, consider an example case where $N_t$=4, where Q=4 (QPSK), where the bit-to-symbol mapping matrix P=[0 1 1 0], and where the ranked parents of the second stage survivors are identified by the hard output unit with indices $idx_1^{(2)}$=[1 0 3 2] (implying that M1=4). In this example, the indexing and repetition unit 304 computes $p_1^{(2)}$=[1 1 1 1 0 0 0 0 0 0 0 1 1 1 1], where each color represents a masking bit from P that was repeated Q times. In particular, the first Q bits are generated by using the first bit value (e.g., "1") in the indices $idx_1^{(2)}$ to retrieve the value (e.g., "1") in the n=1 bit position from the matrix P and repeat it Q times. In addition, the second Q bits are generated by using the second bit value (e.g., "0") in the indices $idx_1^{(2)}$ to retrieve the value (e.g., "0") in the n=0 bit position from the matrix P and repeat it Q times, and so on, with the third Q bits being generated by using the third bit value (e.g., "3") in the indices $idc_1^{(2)}$ to retrieve the value (e.g., "0") in the n=3 bit position from the matrix P and repeat it Q times, and with the final Q bits being generated by using the fourth bit value (e.g., "2") in the indices $idx_1^{(2)}$ to retrieve the value (e.g., "1") in the n=2 bit position from the matrix P and repeat it Q times. The total length of the mask is thus M1Q=16 bits.

In the next tier of bit mask computations, the indexing and repetition unit 304 computes bit masks that satisfy i=j-2 which consist of serial repetitions of certain elements of P as given by the indexes of the surviving 2nd order parents as follows:

$p_1^{(3)}$=P $[idx_1^{(3)}[0]]$ repeated Q times ... P $[idx_1^{(3)}$ $[M_2-1]]$ repeated Q times $p_2^{(4)}$=P $[idx_2^{(4)}[0]]$ repeated Q times ... P $[idx_2^{(4)}$ $[M_3-1]]$ repeated Q times The length of these masks is equal to $M_2$Q and $M_3$Q, again reflecting the number of visited nodes at each stage of the tree except for the first two (whose masks cannot satisfy i=j-2 anymore)

In the final tier of bit mask computations, the indexing and repetition unit 304 computes the final bit mask that satisfies i=j-3 (corresponding to the soft bits of the first layer determined from the fourth level) which consists of serial repetitions of certain elements of P as given by the indexes of the surviving 3rd order parents, as follows:

$p_1^{(4)}$=P $[idx_1^{(4)}[0]]$ repeated Q times ... P $[idx_1^{(4)}$ $[M_3-1]]$ repeated Q times The length of this final bit mask is $M_3$Q elements, which is the number of visited nodes at the final stage of the tree. As seen from the foregoing, the total length of all the masks for a single soft bit is:

$(Q+M_1Q+M_2Q+M_3Q)+(M_1Q+M_2Q+M_3Q)+(M_2Q+M_3Q)+M_3Q=Q(1+2M_1+3M_2+4M_3)$ [bits].

The entire previously described procedure needs to he repeated for the number of all soft bits (q=$\log_2$Q). Thus, the cumulated length for all soft bits is equal to:

Q $\log_2$Q $(1+2M_1+3M_2+4M_3)$ [bits].

Figure 4:
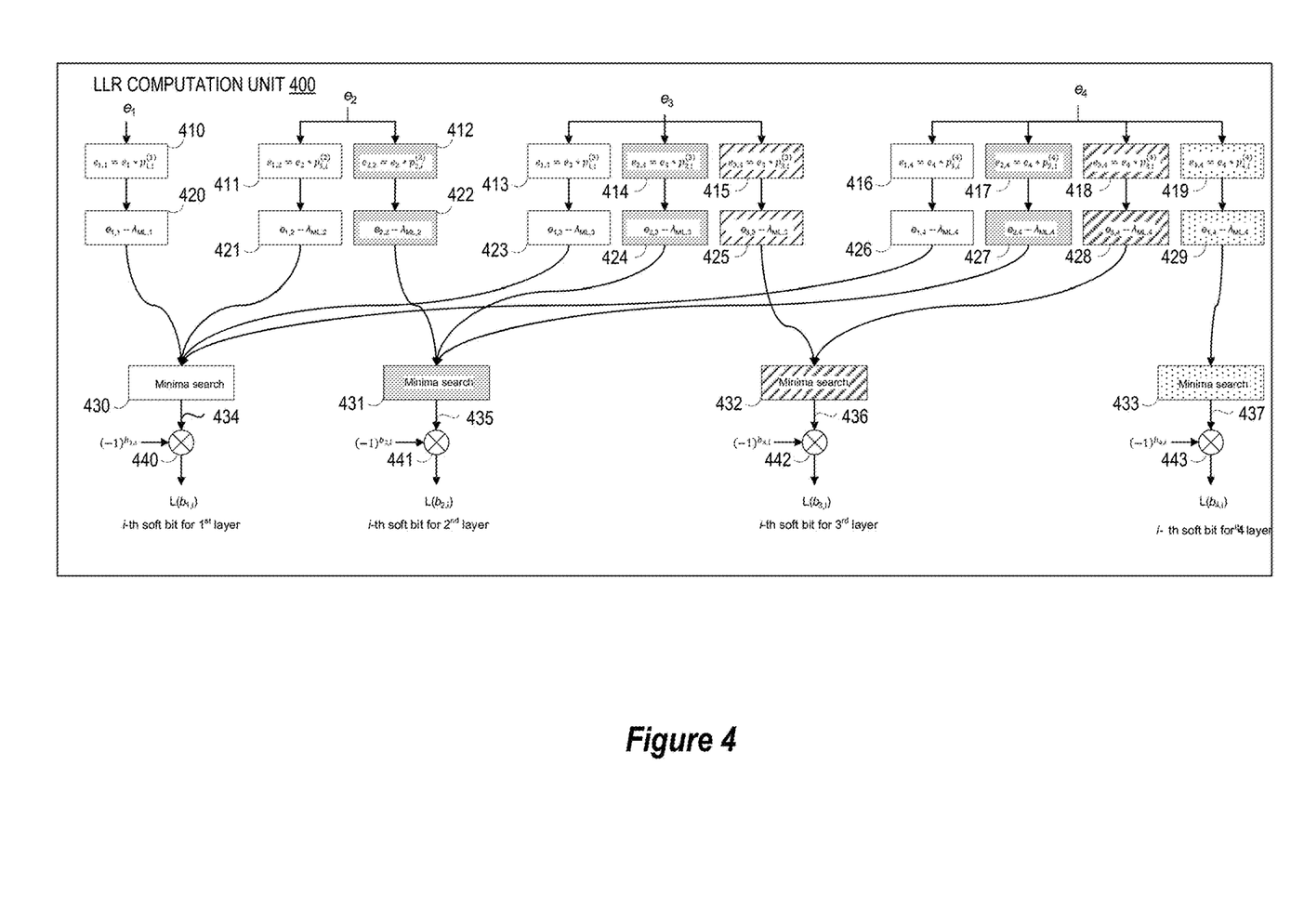
FIG. 4 is a schematic block circuit diagram of a log-likelihood ratio computation unit used in the soft bit computation engine in accordance with selected embodiments of the present disclosure.

To provide additional details for an improved understanding of selected embodiments of the present disclosure, reference is now made to FIG. 4 which shows a schematic block circuit diagram of a log-likelihood ratio computation unit (LCU) 400 in accordance with selected embodiments of the present disclosure. As depicted, the LCU 400 includes a plurality of masking units 410-419, subtraction units 420-429, a plurality of extrema search units 430-433, and a plurality of multiplier units 440-443 which are connected in an example configuration to generate soft bit log-likelihood ratio (LLR) values to assist with MIMO decoding of a signal x sent with $N_t=4$ transmit antennas, though it will be appreciated that extensions are straightforward for different transmit antenna configurations. In the depicted configuration, the LCU 400 generates the soft bit log-likelihood ratio (LLR) values by using only elementary operations to mask the e vector with the MCU bit-masks, subtract the $\lambda_{ML}$ metrics from the masked results, perform an unsigned extrema search over the aggregated results, and then perform a final negative multiplication step.

To compute the LLR values, the LCU 400 is connected to receive as inputs the e vector of explored node metrics, the MCU bit mask values $p_i^{(j)}$, and the $\lambda_{ML}$ vector of winning branch metrics which contains winner nodes at each tree level and the e vector of explored node metrics. For purposes of the present example, the input e vector is assumed to be organized as $N_t$ different vectors $e_k$, each containing the explored nodes at the k-th tree level.

In operation, the masking units 410-419 are connected to combine and mask the input vectors $e_j$ with the MCU bit mask values $p_{m,n}^{(j)}$, thereby generating masked results $e_{m,n}$. In this example, each input vectors $e_j$ has a size $M_jQ$ that is preferably formatted as real, unsigned 8-bit value, and each MCU bit mask $p_{m,n}^{(j)}$ defines a masking vector of 1-bit values having a size $M_jQ$. In selected embodiments, the masking units 410-419 may each be embodied in hardware with an AND gate circuit, in which case the masking operation may be implemented as a trivial multiplication operation where $e_{m,n}=0$ if $p_{m,n}=0$, but otherwise $e_{m,n}=e_j$. However, the masking units 410-419 may also be embodied in software with a point-to-point multiplication operation, or with any suitable functional implementation that produces the desired masking results. In the example shown in FIG. 4, the first input $e_1$ vector is masked with a first MCU bit mask $p_{1,i}^{(1)}$ at a first masking unit 410 which performs a logical AND combination on the inputs, thereby generating a first masked result $e_{1,1}$. In addition, a second input $e_2$ vector is masked, respectively, with second and third MCU bit masks $p_{1,i}^{(2)}$, $p_{2,i}^{(2)}$ at second and third masking units 411, 412 to generate second and third masked results $e_{1,2}$, $e_{2,2}$. In similar fashion, a third input $e_3$ vector is masked, respectively, with fourth, fifth, and sixth MCU bit masks $p_{1,i}^{(3)}$, $p_{2,i}^{(3)}$, $p_{3,i}^{(3)}$ at masking units 413-415 to generate masked results $e_{1,3}$, $e_{2,3}$, $e_{3,3}$. Finally, a fourth input $e_4$ vector is masked, respectively, with MCU masks $p_{1,i}^{(4)}$, $p_{2,i}^{(4)}$, $p_{3,i}^{(4)}$, $p_{4,i}^{(4)}$ at masking units 416-419 to generate masked results $e_{1,4}$, $e_{2,4}$, $e_{3,4}$, $e_{4,4}$.

In the next computational step, the subtraction units 420-429 subtract the scalar metric value $\lambda_{ML,j}$ from the masked results from the masking units 410-419, causing the values for the previously masked results to all have the degenerate value of $-\lambda_{ML,j}$. Implementing the difference operations of the subtraction units 416-419 with overflow ensures that negative values circularly overflow to large positive values, and will not be selected by the minima search blocks 430-433. In selected embodiments, the subtraction units 420-429 may each be embodied in hardware, software, or any other suitable functional implementation that produces the desired subtraction results. In the example shown in FIG. 4, the first subtraction unit 420 subtracts the first $\lambda_{ML,1}$ branch metric value from the first masked result $e_{1,1}$, thereby generating a first subtraction result, $e_{1,1}-\lambda_{ML,1}$. In addition, the second and third subtraction units 421, 422 each subtract the second branch metric value $\lambda_{ML,2}$ from the second and third masked results $e_{1,2}$, $e_{2,2}$, thereby generating a second and third subtraction results, $e_{1,2}-\lambda_{ML,2}$ and $e_{2,2}-\lambda_{ML,2}$. In similar fashion, the subtraction units 423-425 each subtract the third branch metric value $\lambda_{ML,3}$ from the masked results $e_{1,3}$, $e_{2,3}$, $e_{3,3}$, thereby generating a subtraction results, $e_{1,3}-\lambda_{ML,3}$ $e_{2,3}-\lambda_{ML,3-}$ and $e_{3,3}-\lambda_{ML,3}$. Finally, the subtraction units 426-429 each subtract the fourth branch metric value $A_{ML,4}$ from the masked results $e_{1,4}$, $e_{2,4}$, $e_{3,4}$, $e_{4,4}$, thereby generating a subtraction results, $e_{1,4}-\lambda_{ML,4}$, $e2,4-\lambda_{ML,4}$, $e_{3,4}-\lambda_{ML,4}$, and $e_{4,4}-\lambda_{ML,4}$.

In the next computational step, the extrema search units 430-433 are connected as shown to perform an unsigned (non-negative) minima search over the aggregated results. At this point, the fact that the previously masked results are all negative values ensures that they cannot be the output result of the extrema search, and the result of this minima search is the absolute value of the soft bit log-likelihood ratio (LLR) values. In selected embodiments, the extrema search units 430-433 may each be embodied in hardware, software, or any other suitable functional implementation that produces the desired minima search results. In the example shown in FIG. 4, the first minima search unit 430 is connected to perform a search over the aggregated results from the subtraction units 420, 421, 423, and 426, thereby generating a search result 434. In addition, the second minima search unit 431 is connected to perform a search over the aggregated results from the subtraction units 422, 424, and 427, thereby generating a search result 435. In similar fashion, the third minima search unit 432 is connected to perform a search over the aggregated results from the subtraction units 425 and 428, thereby generating a search result 436, while the fourth minima search unit 433 is connected to perform a search over the aggregated results from the subtraction unit 429, thereby generating a search result 437.

In the final computational step, the inversion multiplier units 440-443 are connected as shown to each of the extrema search results 434-437 to perform the required multiplication with +1/−1, thereby generating, respectively, the i-the soft bit LLR value for the first layer $L(b_{1,i})$, the i-the soft bit LLR value for the second layer $L(b_{2,i})$, the i-the soft bit LLR value for the third layer $L(b_{3,i})$, and the i-the soft bit LLR value for the fourth layer $L(b_{4,i})$.

In the depicted ICU 400, the relationship between each layer and the required processing is indicated with the shading of the circuit blocks or units, with the first layer (i.e., the base of the tree) have the largest complexity due to having a larger number of possibilities, while the fourth layer has the least complexity. In particular, the solid white blocks 410-411, 413, 416, 420-421, 423, 426, and 430 perform the processing for the first layer, while the solid gray blocks 412, 414, 417, 422, 424, 427, and 431 perform the processing for the second layer. In addition, the cross-hatched blocks 415, 418, 425, 428, and 432 perform the processing for the third layer, while the dotted blocks 419, 429, and 433 perform the processing for the fourth layer.

In the example case in which there are $N_t=4$ transmit antennas, there are ten (10) masking units 410-419 and ten (10) subtraction units 420-429. However, it will be appreciated that the number masking units and subtraction units increases with number of layers so that there will be $N_r(N_r+1)/2$ masking unit blocks and subtraction unit blocks.

Figure 5:
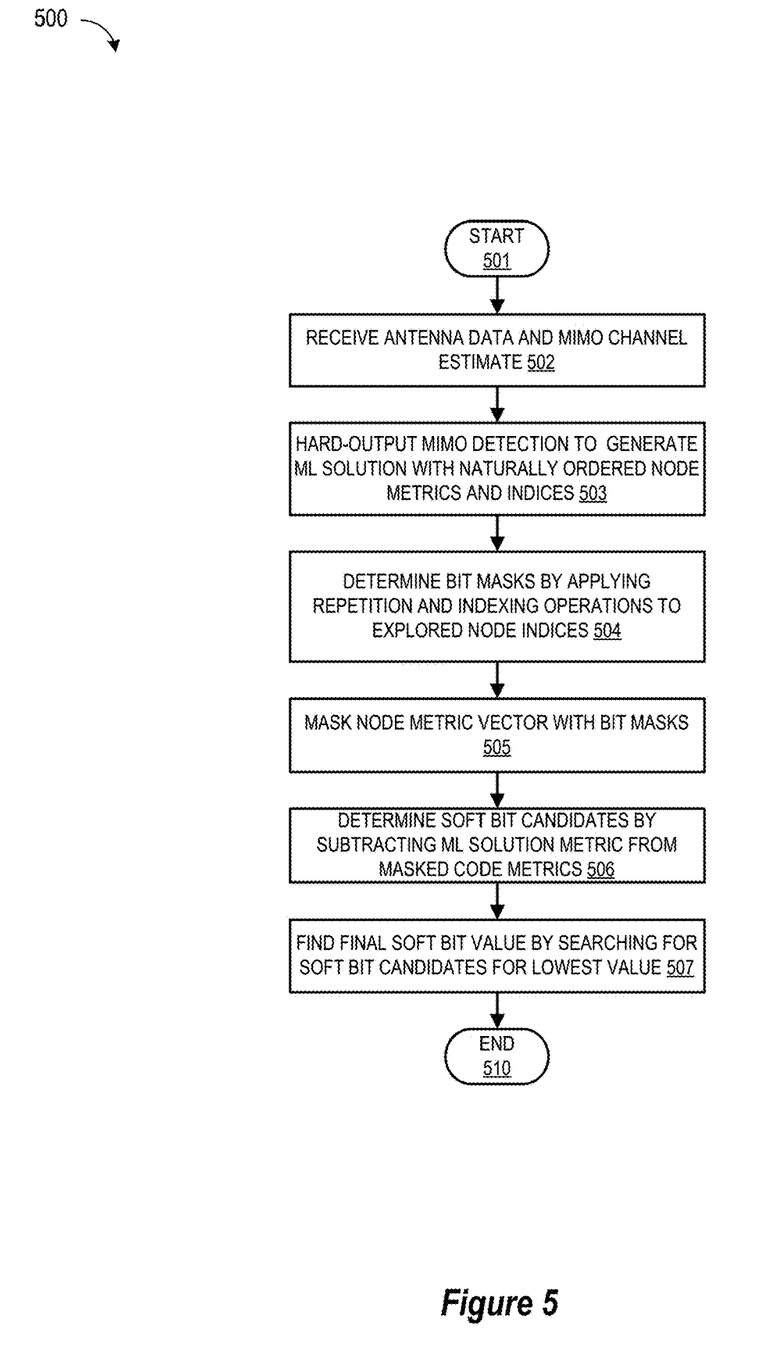
FIG. 5 illustrates a simplified flow chart showing the logic for computing the soft bits corresponding to a MIMO transmission using only elementary operations in accordance with a first selected embodiment of the present disclosure.

To provide additional details for an improved understanding of selected first embodiments of the present disclosure, reference is now made to FIG. 5 which depicts a simplified flow chart 500 showing the logic for computing the soft bits corresponding to a MIMO transmission using only elementary operations. In an example embodiment, the processing shown in FIG. 5 may be performed at a baseband processor with a soft bit computation engine embodied with dedicated hardware, software, or hybrid implementations and configured for processing tree decode information from a non-linear MIMO detector by computing soft bits by computing all possible values and masking the results that correspond to a switched bit decision.

At step 501, the methodology starts with the control logic and/or hardware at the baseband processor system which is configured to receive antenna data y (step 502). As will be appreciated, a signal processing unit may be used to detect the presence of transmitted data signals y on a plurality of receive antennas. In addition, the baseband processor system may also receive MIMO channel estimate information H for the transmission channel, such as by using suitable channel estimation techniques and/or by re-using a previously computed MIIMO channel estimate H.

Based on the received data signal y and channel profile information H, the receiver performs hard-output MIMO detection to generate hard bit decisions for the symbols detected in the received data signal y at step 503. In selected embodiments, a non-linear hard-output MIMO detector may use a tree decoder to generate tree decode information specifying the ML path to a binary "1" or "0" output bit value in the form of a Maximum Likelihood ("ML") solution with naturally ordered node metrics and indices. In particular, the non-linear hard output MIMO detector unit may be connected and configured to receive and process the received signal y, channel matrix H, and signal constellation C to compute therefrom a first output vector ($\lambda_{ML}$) of the metrics of all nodes that form the ML path, a second naturally ordered output vector (e) of all explored node metrics, and a third output vector (idx) of the indices in the signal constellation C of the retained nodes at each stage.

Using the tree decode information, the receiver may then initiate computation of soft bits at step 504 by first determining bit masks that identify the node error metrics of e having an opposite bit decision to the hard decision bit. In selected embodiments, a soft bit computation engine may use a mask computation unit (MCU) that applies repetition and indexing operations to the explored node indices in order to generate the hit masks. For example, a software-embodied MCU may be connected to receive and process the third output vector (idx) in order to generate MCU bit-masks based on inputs specifying the number of bits per constellation symbol (e.g., $q=\log_2 Q$), a vector representation giving the number of retained nodes at each stage (e.g., $M=N_r \times 1$ vector), and a matrix presentation of the binary entries that represents the bit-to-symbol mapping (e.g., $P=Q \times q$ matrix).

Using the bit masks, the receiver may then mask the node metrics at step 505. In selected embodiments, a soft bit computation engine may use an LLR computation unit (LCU) that masks node metric vectors with the bit masks computed at step 504 in order to generate masked e vector node error metric values. For example, the LCU may include a plurality of hardware multipliers which provide a logical AND function for combining the second output vector (e) along with the MCU bit-masks in order to generate the masked node metric vector.

Using the masked node metric vector values, the receiver may then determine soft bit candidates at step 506. In selected embodiments, a soft bit computation engine may use the LLR computation unit (LCU) to identify soft bit candidates by subtracting the ML solution metric from the masked code metrics (computed at step 505) in order to generate masked e vector node error metric values. For example, the LCU may include a plurality of difference or subtraction units which subtract the first output vector ($\lambda_{ML}$) from the masked node metric vector in order to generate the candidate soft bit log-likelihood ratio (LLR) values.

At step 507, the final soft bit LLR values are computed by searching the candidate LLR values to find the lowest value candidate. In selected embodiments, a soft bit computation engine may use the LLR computation unit (LCU) to compute the final soft bit LLR values by using extrema search units to identify the candidate soft bit candidate having the lowest or minima value. Since the minima search result is the absolute value of the sought-after LLR, one final multiplication with +1/−1 is required. At step 510, the process ends.

Figure 6:
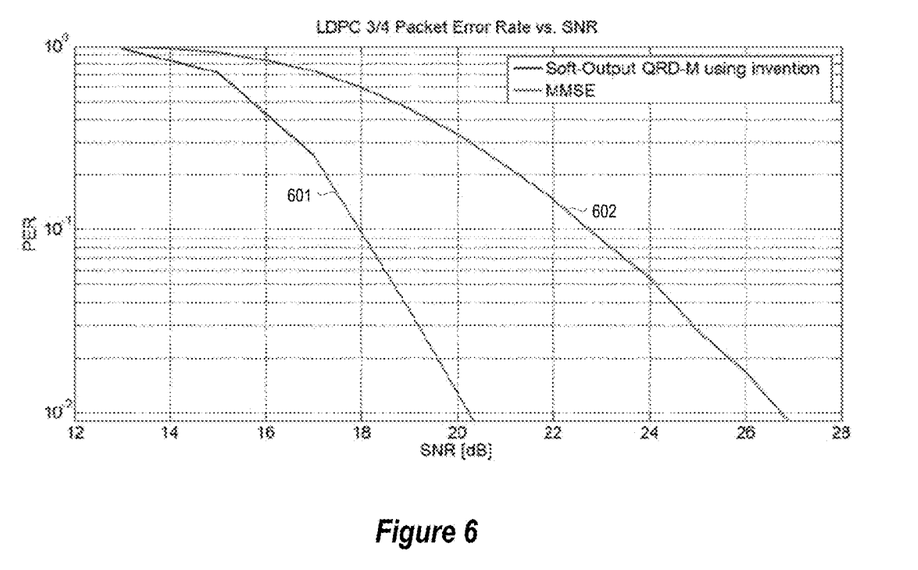
FIG. 6 is a graph showing an encoded gain for the wireless non-linear MIMO detector communication receiver system in accordance with selected embodiments of the present disclosure.

To provide additional details for an improved understanding of selected embodiments of the present disclosure, reference is now made to FIG. 6 which depicts a MATLAB simulation graph showing an encoded gain for the wireless non-linear MIMO detector communication receiver system in accordance with selected embodiments of the present disclosure. The rightmost curve 602 shows the output gain characteristics of a MIMO system with linear minimum mean square error (MMSE) detector, while the leftmost curve 601 shows the output gain characteristics of non-linear MIMO detector which uses a non-linear QR decomposition based M-algorithm (QRD-M) MIMO detector and a soft bit computation engine to compute soft bits. In generating encoded gain curves 601-602, the simulation scenario assumes a 4×4 MIMO transmission ($N_t=N_r=4$), 64-QAM modulation (C=64), LDPC coding with rate 3/4, and a fading channel that is similar to IEEE TGn Channel D, but with different subcarrier spacing. The horizontal axis shows the S/N ratio (SNR), and the vertical axis shows the packet error rate (PER). It is apparent from the PER characteristics that there is considerable performance gain from using the Soft-Output QRD-M detector, namely over 4.5 dB at $PER=10^{-1}$.

The table below shows more performance gain results showing that the soft bit computation disclosed herein keeps its advantage for different QAM schemes or MIMO scenarios when compared to linear soft-output MMSE detection:

| Performance Gain in dB at PER = $10^{-1}$ | | | |
|---|---|---|---|
| | MIMO | | |
| Mod. | 4 × 4 | 4 × 3 | 4 × 2 |
| QPSK (4-QAM) | 2.6 dB | 1.5 dB | 0.5 dB |
| 16-QAM | 4.6 dB | 2.1 dB | 0.7 dB |
| 64-QAM | 4.7 dB | 1.6 dB | 0.4 dB |

As disclosed herein, the improvement in performance results is provided with a software computation engine that is compatible with any breadth-first, hard-output non-linear MIMO detector, and that may be implemented with low complexity hardware and/or software units which are tasked with computing the soft bits. In particular and as described hereinabove, selected embodiments of the soft bit computation engine may use a Mask Computation Unit (MCU) and the LLR Computation Unit (LCU), each of which drives the complexity in a different way through the nature of the processing that happens inside them. In particular, the MCU will drive the overall memory requirements, while the LCU will drive the overall latency and can trade-off complexity (i.e., die size) vs. processing time.

With respect to the MCU 300 shown in FIG. 3, the operations are performed with by repeating the inputs a number of times and indexing a given vector. Since these operations are easy to implement using basic logic functions, the MCU may be implemented with a very high degree of parallelism, leaving the memory requirements for storing the outputs to be the driving factor in complexity. The table below shows expected memory requirements for some typical MIMO scenarios:

| | MCU Memory Requirements in Bytes | | |
|---|---|---|---|
| | MIMO | | |
| Mod. | 4 × 4 | 3 × 3 | 2 × 2 |
| QPSK (4-QAM) | <0.1 kB | <0.1 kB | <0.1 kB |
| 16-QAM | 0.7 kB | 0.5 kB | 0.3 kB |
| 64-QAM | 12.7 kB | 8.1 kB | 6.2 kB |

On the other hand, it will be appreciated that there are multiple ways to design the LCU 400, based on the available die size and acceptable latency. With respect to the LCU 400 example shown in FIG. 4, selected embodiments of the LCU may be constructed with elementary blocks, including mask blocks (for masking or multiplying a real vector with a binary vector), subtraction or different blocks (for computing the different between two real vectors extrema search blocks (for performing minima search operations), and a sign change block.

In order to minimize the latency in the LCU, the critical signal path will be formed by chaining the previous functions in their exact order. In an example embodiment where the LCU is embodied in software that is executed with NXP's Vector Signal Processing Accelerator (VSPA), the total latency measured in VSPA cycles for the most aggressive 4×4 MIMO, 64-QAM scenario is Latency=1+1+2+log 2(64*96)÷1=17 cycles. The table below shows the complexity of the LCU expressed as number of required fundamental blocks of each category for several MIMO scenarios:

| | Number of required blocks of each type | | |
|---|---|---|---|
| | MIMO | | |
| Mod. | 4 × 4 | 3 × 3 | 2 × 2 |
| QPSK (4-QAM) | Mask: 20<br>Diff: 20<br>Min: 8<br>Sign: 8 | Mask: 12<br>Diff: 12<br>Min: 6<br>Sign: 6 | Mask: 6<br>Diff: 6<br>Min: 4<br>Sign: 4 |
| 16-QAM | Mask: 40<br>Diff: 40<br>Min: 16<br>Sign: 16 | Mask: 24<br>Diff: 24<br>Min: 12<br>Sign: 12 | Mask: 12<br>Diff: 12<br>Min: 8<br>Sign: 8 |

-continued

| | Number of required blocks of each type | | |
|---|---|---|---|
| | MIMO | | |
| Mod. | 4 × 4 | 3 × 3 | 2 × 2 |
| 64-QAM | Mask: 60<br>Diff: 60<br>Min: 24<br>Sign: 24 | Mask: 36<br>Diff: 36<br>Min: 18<br>Sign: 18 | Mask: 18<br>Diff: 18<br>Min: 12<br>Sign: 12 |

To further refine the complexity of the LCU, each of the four basic block types should be replaced with the number of gates it takes to implement on hardware.

One major advantage here is that the LLRs are usually represented using a small number of bits. For example, LDDC coding can work with LLRs represented on as few as 6 bits. This affects the format of the e and A values in the LCU internal structure (FIG. 4), leading to reductions in the overall die size since the complexity of each block will be reduced.

In addition, it will be appreciated that trade-offs can be made in terms of latency and complexity. For example, using only half of the required number of blocks in the previous table will decrease the die size but lead to a doubled latency.

As disclosed herein, the disclosed method, system, and apparatus for computing soft bits may be implemented as a soft bit computation engine embodied with dedicated hardware, software, or hybrid implementations that is connected and controlled by control logic and/or computer program product having program code portions for performing steps of a method and/or for performing functions of a device or system which uses elementary operations to process tree decode outputs from a non-linear MIMO detector, such as the node metrics and indices at each level for an ML path, to generate soft bit log-likelihood ratio (LLR) values by masking the naturally ordered vector of all explored node metrics, subtracting the vector of the metrics of all nodes that form the ML path, performing an unsigned extrema search over the aggregated results. Although embodiments are described in the context of processing the tree decode outputs from a non-linear MIMO detector by computing all possible values and masking the results that correspond to a switched bit decision, the proposed soft bit computation method, system, and apparatus may be used with depth- and breadth-first hard-output detectors (such as SOMA, ML, or K-best hard-output MEMO detectors, etc.), so long as the naturally ordered assumption is preserved. In contrast to conventional approaches which organize the node metrics in tables, the soft bit computation engine provides a much more relaxed constraint to impose on the hard-output detector which uses the disclosed masking procedure.

Some of the above embodiments, as applicable, may be implemented using a variety of different data processing systems. For example, although FIG. 2 and the discussion thereof describe an exemplary data processing architecture wherein the soft output unit employs a combination of a mask computation unit and LLR computation unit to implement an algorithm that is designed with a high degree of parallelism in mind, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality, Furthermore, those skilled in the art will recognize that boundaries between the functionality of the above described operations merely illustrative. The functionality of multiple operations may be combined into a single operation, and/or the functionality of a single operation may be distributed in additional operations, Moreover, alternative embodiments may include multiple instances of a particular operation, and the order of operations may be altered in various other embodiments.

By now it should be appreciated that there has been provided an apparatus, method, program code, and system for computing soft bits in a non-linear MIMO detector receiver. In the disclosed apparatus, method, program code, and system, a signal is received at a plurality of receive antennas. On the received signal, a decoding operation is performed using a channel estimate information and a decoding tree to produce output data for a bit estimation value which includes a maximum likelihood solution along with a naturally ordered vector identifying all explored node metrics and node indices. In selected embodiments, the decoding operation is a non-linear hard-output MIMO decoding Operation performed on the signal. In addition, the output data may include a metric vector $\lambda_{ML}$ representing a most likely decoding tree path, a naturally ordered vector e of all explored node metrics in the decoding tree, and an index vector idx of indices in a signal constellation vector of retained nodes at each stage. For each bit estimation value, soft bit values are generated by determining a set of bit-masks through repetition and indexing operations applied on the explored node indices; masking the naturally ordered vector with the set of bit-masks to generate masked node metrics; determining candidate soft bit values by subtracting metrics of all nodes that form the maximum likelihood solution from the masked node metrics; and determining a final soft bit value by identifying which of the candidate soft bit values has a lowest value. In selected embodiments, the set of bit-masks may be determined by computing bit masks to identify node error metrics of the naturally ordered vector e having an opposite bit decision to the hard decision bits. In addition, the naturally ordered vector may be masked by masking the naturally ordered vector e with the bit masks to generate a first masked vector. In addition, the candidate soft bit values may be determined by subtracting the metric vector $\lambda_{ML}$ from the first masked vector to generate soft bit candidate values. Finally, the final soft bit values may be determined by performing an unsigned minima search over the soft bit candidate values.

In another form, there is provided a Multiple Input Multiple Output (MIMO) detector and associated method of operation. In the disclosed MIMO detector, a plurality of receive antennas receives a signal. In addition, the MIMO detector may include a hard-output unit that performs a first decoding operation on the signal using channel estimate information and a decoding tree, thereby producing output data for a bit estimation value which may include a maximum likelihood solution along with a naturally ordered vector identifying all explored node metrics and node indices. In selected embodiments, the hard-output unit may be implemented as a non-linear hard-output MIMO decoder which produces output data comprising a metric vector $\lambda_{ML}$ representing a most likely decoding tree path, a naturally ordered vector e of all explored node metrics in the decoding tree, and an index vector idx of indices in a signal constellation vector of retained nodes at each stage. The MIMO detector also includes a soft-output unit which includes a mask computation unit for generating a set of bit-masks and a log-likelihood ratio (LLR) computation unit for generating soft bit values for each bit estimation value. In particular, the soft-output unit is connected to determine the set of bit-masks through repetition and indexing operations applied on the explored node indices; to mask the naturally ordered vector with the set of bit-masks to generate masked node metrics; to determine candidate soft bit values by subtracting metrics of all nodes that form the maximum likelihood solution from the masked node metrics; and to determine a final soft bit value by identifying which of the candidate soft bit values has a lowest value. In selected embodiments of the soft-output unit, there is provided, for each soft bit of each layer in the decoding tree, a dedicated hardware mask computation unit and a dedicated hardware LLR computation unit. In other embodiments of the soft-output unit, there is provided a fixed number of dedicated hardware mask computation units and dedicated hardware LLR computation units that are scheduled in a round-robin fashion to compute each soft bit of each layer in the decoding tree. In still other embodiments of the soft-bit computation unit, there is provided a software-implemented LLR computation unit and a fixed number of dedicated hardware mask computation units that are scheduled in a round-robin fashion to compute each soft bit of each layer in the decoding tree. In similar fashion, there are embodiments of the soft-bit computation unit where there is provided comprises a software-implemented mask computation unit and a fixed number of dedicated hardware LLR computation units that are scheduled in a round-robin fashion to compute each soft bit of each layer in the decoding tree. In selected embodiments, the set of bit-masks may be determined by computing bit masks to identify node error metrics of the naturally ordered vector e having an opposite bit decision to the hard decision bits. In addition, the naturally ordered vector may be masked by masking the naturally ordered vector e with the bit masks to generate a first masked vector. In addition, the candidate soft bit values may be determined by subtracting the metric vector $\lambda_{ML}$ from the first masked vector to generate soft bit candidate values. Finally, the final soft bit values may be determined by performing an unsigned minima search over the soft bit candidate values.

In yet another form, there is provided a soft-bit computation unit and associated method of operation for generating soft bit values for each bit estimation value. As disclosed, the soft-bit computation unit includes a mask computation unit for determining a set of bit-masks through repetition and indexing operations applied on explored node indices identified in a naturally ordered vector generated by a non-linear hard-output MIMO decoder. In selected embodiments, the mask computation unit may include a repetition unit for generating bit masks $p_i^{(j)}$ that satisfy i=j; and an indexing and repetition unit for generating bit masks $p_i^{(j)}$ that satisfy i<j. In addition, the soft-bit computation unit includes a log-likelihood ratio (LLR) computation unit for generating soft bit values for each bit estimation value by masking the naturally ordered vector with the set of bit-masks to generate masked node metrics, determining candidate soft bit values by subtracting metrics of all nodes that form the maximum likelihood solution from the masked node metrics, and determining a final soft bit value by identifying which of the candidate soft bit values has a lowest value. In selected embodiments, the LLR computation unit may include a multiplication block connected to mask the naturally ordered vector with the set of bit-masks, thereby generating masked results; an arithmetic subtraction block connected to subtract from the masked results an output vector ($4_m$) of metrics of all nodes that form a Maximum Likelihood path, thereby generating subtraction results; and an extrema search block connected to perform an unsigned extrema search over aggregated subtraction results, thereby calculating soft bit log-likelihood ratio (LLR) values for input to an error correction code (ECC) decoder.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Although the described exemplary embodiments disclosed herein are directed to an exemplary soft bit computation engine, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for computing soft bits at a wireless Multiple Input Multiple Output (MIMO) receiver system, comprising:
   receiving a signal at a plurality of receive antennas of the MIMO receiver system;
   performing, at a MIMO detector, a first decoding operation on the signal using a channel estimate information and a decoding tree to produce output data for a bit estimation value comprising a maximum likelihood solution along with a naturally ordered vector identifying all explored node metrics and node indices; and
   generating, at a soft bit computation engine, soft bit values for each bit estimation value by:
   determining a set of bit-masks through repetition and indexing operations applied on the explored node indices;
   masking the naturally ordered vector with the set of bit-masks to generate masked node metrics;
   determining candidate soft bit values by subtracting metrics of all nodes that form the maximum likelihood solution from the masked node metrics; and
   determining a final soft bit value by identifying which of the candidate soft bit values has a lowest value.

2. The method of claim 1, where performing the first decoding operation comprises performing non-linear hard-output MIMO decoding on the signal.

3. The method of claim 1, where the output data comprises a metric vector $\lambda_{ML}$ representing a most likely decoding tree path, a naturally ordered vector e of all explored node metrics in the decoding tree, and an index vector idx of indices in a signal constellation vector of retained nodes at each stage.

4. The method of claim 3, where determining the set of bit-masks comprises computing bit masks to identify node error metrics of the naturally ordered vector e having an opposite bit decision to the hard decision bits.

5. The method of claim 4, where masking the naturally ordered vector comprises masking the naturally ordered vector e with the bit masks to generate a first masked vector.

6. The method of claim 5, where determining candidate soft bit values comprises subtracting the metric vector $\lambda_{ML}$ from the first masked vector to generate soft bit candidate values.

7. The method of claim 6, where determining the final soft bit values comprises performing an unsigned minima search over the soft bit candidate values.

8. A Multiple Input Multiple Output (MIMO) detector, comprising:
   a plurality of receive antennas for receiving a signal;
   a hard-output unit which performs a first decoding operation on the signal using channel estimate information and a decoding tree to produce output data for a bit estimation value comprising a maximum likelihood solution along with a naturally ordered vector identifying all explored node metrics and node indices; and
   a soft-output unit comprising a mask computation unit for generating a set of bit-masks and a log-likelihood ratio (LLR) computation unit for generating soft bit values for each bit estimation value by:
determining the set of bit-masks through repetition and indexing operations applied on the explored node indices;
masking the naturally ordered vector with the set of bit-masks to generate masked node metrics;
determining candidate soft bit values by subtracting metrics of all nodes that form the maximum likelihood solution from the masked node metrics; and
determining a final soft bit value by identifying which of the candidate soft bit values has a lowest value.

9. The MIMO detector of claim 8, where soft-output unit comprises, for each soft bit of each layer in the decoding tree, a dedicated hardware mask computation unit and a dedicated hardware LLR computation unit.

10. The MIMO detector of claim 8, where soft-output unit comprises a fixed number of dedicated hardware mask computation units and dedicated hardware LLR computation units that are scheduled in a round-robin fashion to compute each soft bit of each layer in the decoding tree.

11. The MIMO detector of claim 8, where soft-output unit comprises a software-implemented LLR computation unit and a fixed number of dedicated hardware mask computation units that are scheduled in a round-robin fashion to compute each soft bit of each layer in the decoding tree.

12. The MIMO detector of claim 8, where soft-output unit comprises a software-implemented mask computation unit and a fixed number of dedicated hardware LLR computation units that are scheduled in a round-robin fashion to compute each soft bit of each layer in the decoding tree.

13. The MIMO detector of claim 8, where the hard-output unit comprises a non-linear hard-output MIMO decoder which produces output data comprising a metric vector $\lambda_{ML}$ representing a most likely decoding tree path, a naturally ordered vector e of all explored node metrics in the decoding tree, and an index vector idx of indices in a signal constellation vector of retained nodes at each stage.

14. The MIMO detector method of claim 13, where determining the set of bit-masks comprises computing bit masks to identify node error metrics of the naturally ordered vector e having an opposite bit decision to the hard decision bits.

15. The MIMO detector method of claim 14, where masking the naturally ordered vector comprises masking the naturally ordered vector e with the bit masks to generate a first masked vector.

16. The MIMO detector method of claim 15, where determining candidate soft bit values comprises subtracting the metric vector $\lambda_{ML}$ from the first masked vector to generate soft bit candidate values.

17. The MIMO detector method of claim 16, where determining the final soft bit values comprises performing an unsigned minima search over the soft bit candidate values.

18. A soft-bit computation unit for generating soft bit values for each bit estimation value, comprising:
a mask computation unit for determining a set of bit-masks through repetition and indexing operations applied on explored node indices identified in a naturally ordered vector generated by a non-linear hard-output MIMO decoder; and
a log-likelihood ratio (LLR) computation unit for generating soft bit values for each bit estimation value by masking the naturally ordered vector with the set of bit-masks to generate masked node metrics, determining candidate soft bit values by subtracting metrics of all nodes that form the maximum likelihood solution from the masked node metrics, and determining a final soft bit value by identifying which of the candidate soft bit values has a lowest value.

19. The soft-bit computation unit of claim 18, where the mask computation unit comprises:
a repetition unit for generating bit masks $p_i^{(j)}$ that satisfy i=j; and
an indexing and repetition unit for generating bit masks $p_i^{(j)}$ that satisfy i<j.

20. The soft-bit computation unit of claim 18, where the LLR computation unit comprises:
a multiplication block connected to mask the naturally ordered vector with the set of bit-masks, thereby generating masked results;
an arithmetic subtraction block connected to subtract from the masked results an output vector ($\lambda_{ML}$) of metrics of all nodes that form a Maximum Likelihood path, thereby generating subtraction results; and
an extrema search block connected to perform an unsigned extrema search over aggregated subtraction results, thereby calculating soft bit log-likelihood ratio (LLR) values for input to an error correction code (ECC) decoder.

* * * * *